United States Patent [19]
Gill, Jr.

[11] Patent Number: 4,989,345
[45] Date of Patent: Feb. 5, 1991

[54] CENTRIFUGAL SPIN DRYER FOR SEMICONDUCTOR WAFER

[76] Inventor: Gerald L. Gill, Jr., 3502 E. Atlanta Ave., Phoenix, Ariz. 85040

[21] Appl. No.: 451,950

[22] Filed: Dec. 18, 1989

[51] Int. Cl.⁵ .............................................. F26B 17/24
[52] U.S. Cl. .............................................. 34/58; 34/8; 34/184; 118/52; 118/728
[58] Field of Search ............... 34/58, 8, 59, 184, 69; 118/52, 53, 56, 320, 728, 729, 730

[56] References Cited

U.S. PATENT DOCUMENTS

| | | | |
|---|---|---|---|
| 4,313,266 | 2/1982 | Tam | 34/8 |
| 4,489,501 | 12/1984 | Aigo | 34/58 |
| 4,525,938 | 7/1985 | Aigo | 34/58 |
| 4,651,440 | 3/1987 | Karl | 34/58 |
| 4,677,758 | 7/1987 | Aigo | 34/658 |
| 4,677,759 | 7/1987 | Inamura | 34/58 |
| 4,724,619 | 2/1988 | Poli et al. | 34/58 |
| 4,851,263 | 7/1989 | Ishii et al. | 118/53 |

*Primary Examiner*—Henry A. Bennet
*Assistant Examiner*—Denise L. Ferensic
*Attorney, Agent, or Firm*—Tod R. Nissle

[57] ABSTRACT

Apparatus for spin drying a semiconductor wafer by centrifugal force. The apparatus spins the wafer about a selected axis while the wafer is being rinsed, and then displaces the wafer away from the axis along a path of travel circumscribing the axis to dry the wafer.

5 Claims, 2 Drawing Sheets

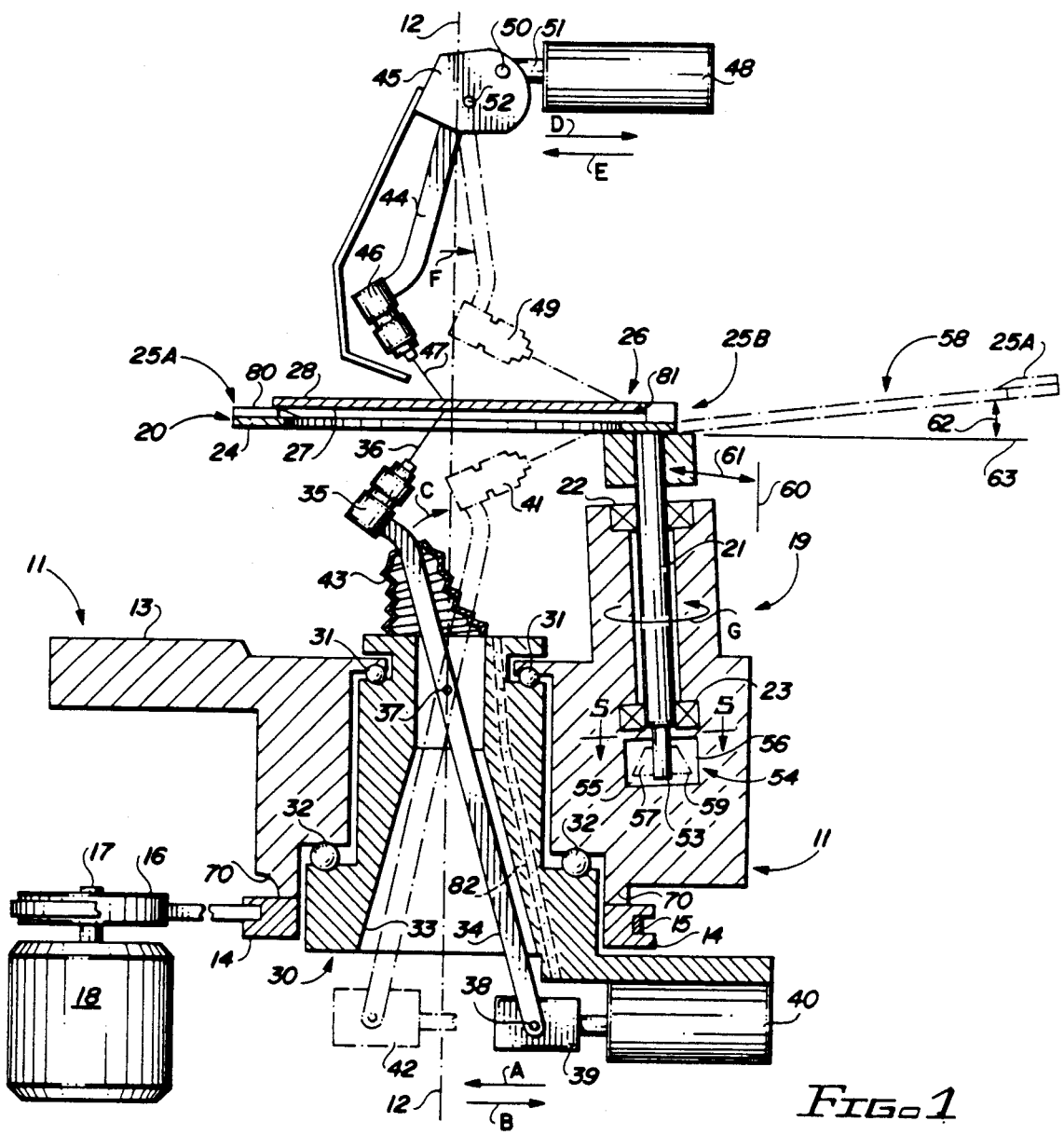
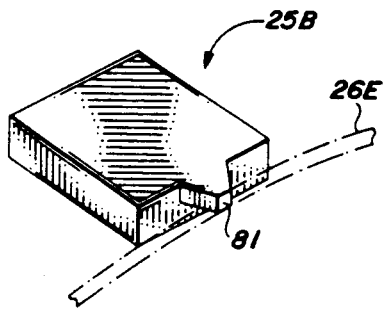
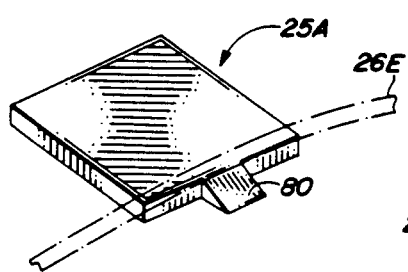
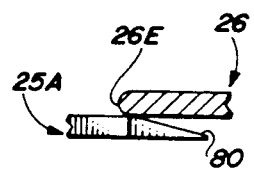

CENTRIFUGAL SPIN DRYER FOR SEMICONDUCTOR WAFER

This invention relates to apparatus for removing by centrifugal force liquids from the surfaces of a semiconductor wafer.

More particularly, the invention relates to apparatus which simultaneously rinses both faces of a circular semiconductor wafer while rotating the wafer to draw by centrifugal force liquid from the wafer faces and which, after the wafer has been rinsed, moves the wafer to a new operative position to increase the strength of centrifugal forces acting on the wafer to dry the wafer.

The utilization of rotary or spin devices to dry a semiconductor wafer is well known in the art. See, for example, U.S. Pat. Nos. 4,489,501 to Aigo, 4,677,759 to Inamura, and 4,525,938 to Aigo. While such prior art devices are, in their own right, useful, there are disadvantages associated with such devices. First, prior art devices often are rotated at a relatively low RPM when the wafer is being rinsed with a fluid and must then be rotated at a high RPM in the range of 4,000 to 10,000 RPM to remove particulate from the wafer. Second, existing semiconductor spin dry devices often center a wafer on and spin the wafer about an axis and are not intended to facilitate the removal of particulate from the dead center of the wafer. Third, conventional semiconductor wafer spin dry devices are not adapted to enable a wafer to be rotated at a low RPM during both rinsing and drying of the wafer. Rotating a wafer at a high RPM significantly increases the complexity of the drive of the motor used to rotate the wafer.

Accordingly, it would be highly desirable to provide improved semiconductor wafer spin drying apparatus which would rinse the surfaces of a semiconductor wafer while the wafer is centered on and rotated about an axis and which would, after rinsing of the wafer is completed, dry the entire surface of the wafer, including the wafer center, while rotating the wafer at a relatively low RPM.

Therefore, it is a principal object of the invention to provide improved apparatus for removing by centrifugal force fluids from the surfaces of a semiconductor wafer.

A further object of the invention is to provide improved semiconductor spin drying apparatus which generates centrifugal forces acting on a semiconductor wafer while simultaneously rinsing both the upper and lower surfaces of the wafer.

Another object of the invention is to provide improved semiconductor wafer spin drying apparatus of the type described which, after rinsing of a semiconductor wafer is completed, alters the path of rotation of the wafer to increase the strength of centrifugal forces acting on the wafer and to reduce the RPM required to efficiently dry the wafer.

Still another object of the instant invention is to provide improved semiconductor wafer spin drying apparatus which permits the upper and lower surfaces of a semiconductor wafer to be rinsed by stationary nozzles while the wafer rotates.

Yet another object of the invention is to provide improved semiconductor wafer spin drying apparatus which spins a circular semiconductor wafer around an axis on which the wafer is centered and subsequently also rotates the wafer around the same axis in a circumferential path of travel which is spaced away from the axis and increases the centrifugal forces acting on the wafer.

These and other, further and more specific objects and advantages of the invention will be apparent to those skilled in the art from the following detailed description thereof, taken in conjunction with the drawings, in which:

FIG. 1 is a partial section elevation view illustrating semiconductor wafer spin drying apparatus constructed in accordance with the principles of the invention;

Figure 2:
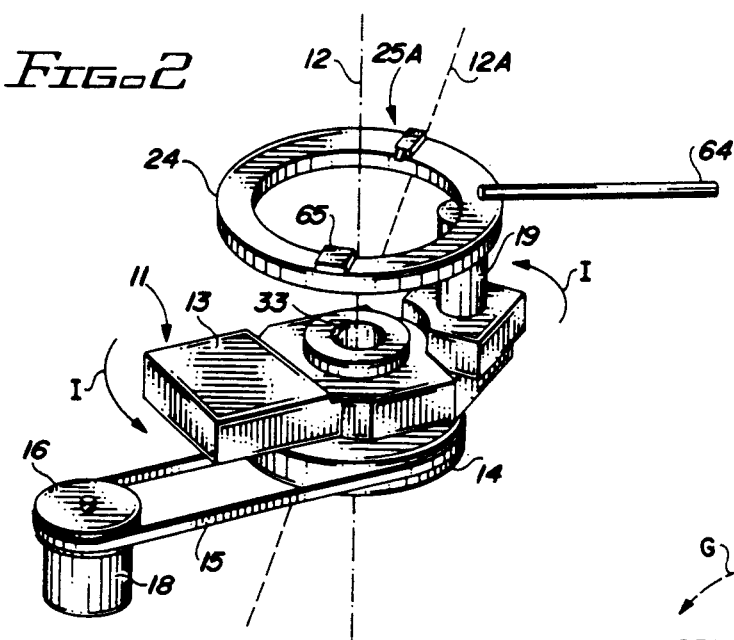
FIG. 2 is perspective view further illustrating principal components of the semiconductor spin drying apparatus of FIG. 1.

Briefly, in accordance with my invention, I provide an improved semiconductor wafer spin drying apparatus. The wafer has an upper surface and a lower surface. The improved apparatus dries the wafer by centrifugal forces and comprises a base rotatable about a first selected axis at variable RPM including a first RPM and a second RPM greater than the first RPM; control arm means spaced away from the axis and connected to and outwardly extending from the base; a carrier spaced away from the base for supporting the semiconductor wafer such that the lower surface of the wafer faces the base; and, means for pivotally connecting the semiconductor wafer carrier to the control arm means to pivot the carrier about a second selected axis different from the first selected axis. The semiconductor wafer carrier moves between at least two operative positions, a first operative position with the wafer in the carrier spaced away from the base and in a first orientation with respect to said control arm means, and a second operative position with the wafer pivoted by centrifugal force about the second axis away from the first selected axis to a second orientation with respect to said control arm means. At least one of the pair consisting of the semiconductor wafer carrier and the semiconductor wafer is weighted such that when the base is rotated at the first RPM the semiconductor wafer carrier is in the first operative position rotating at the first RPM with the base, and when the base is rotated at the second RPM the semiconductor wafer carrier is in the second operative position rotating at the second RPM with the base. The apparatus includes nozzle means for spraying a fluid stream against the lower surface of the wafer when the wafer is in the first operative position rotating with the base. The spray nozzle means can be mounted on and rotate with the base. Alternately, the spray nozzle means can extend upwardly through an opening formed in the base such that the nozzle means is separate and free from the base and the base rotates about the nozzle means.

In accordance with another embodiment of my invention, I provide an improved semiconductor wafer spin drying apparatus. The wafer has an upper surface and a lower surface. The improved apparatus dries the wafer by centrifugal forces and comprises a base rotatable about a first selected axis at variable RPM including a first RPM and a second RPM greater than the first RPM; control arm means spaced away from the axis and connected to and outwardly extending from the base; a carrier spaced away from the base for supporting the semiconductor wafer; and, means for pivotally connecting the semiconductor wafer carrier to the control arm means to pivot the carrier about a second selected axis different from the first selected axis. The semiconductor wafer carrier moves between at least two operative positions, a first operative position with the wafer in the carrier spaced away from the base and in a first orientation with respect to said control arm means, and a second operative position with the wafer pivoted by centrifugal force about the second axis away from the first selected axis to a second orientation with respect to said control arm means. At least one of the pair consisting of the semiconductor wafer carrier and the semiconductor wafer is weighted such that when the base is rotated at the first RPM the semiconductor wafer carrier is in the first operative position rotating at the first RPM with the base, and when the base is rotated at the second RPM the semiconductor wafer carrier is in the second operative position rotating at the second RPM with the base.

In still another embodiment of my invention, I provide an improved semiconductor wafer spin drying apparatus. The wafer has an upper surface and a lower surface. The improved apparatus dries the wafer by centrifugal forces and comprises a base rotatable about a first selected axis at variable RPM including a first RPM and a second RPM greater than the first RPM; control arm means spaced away from the axis and connected to and outwardly extending from the base; a carrier spaced away from the base for supporting the semiconductor wafer such that the lower surface of the wafer faces the base; means for pivotally connecting the semiconductor wafer carrier to the control arm means to pivot the carrier about a second selected axis different from the first selected axis; and, an opening formed about the first axis and extending through the base. The semiconductor wafer carrier moves between at least two operative positions, a first operative position with the wafer in the carrier spaced away from the base over the opening and intersected by and centered on the first selected axis and in a first orientation with respect to said control arm means, and a second operative position with the wafer pivoted by centrifugal force about the second axis away from the first selected axis to a second orientation with respect to said control arm means. At least one of the pair consisting of the semiconductor wafer carrier and the semiconductor wafer is weighted such that when the base is rotated at the first RPM the semiconductor wafer carrier is in the first operative position rotating at the first RPM with the base, and when the base is rotated at the second RPM the semiconductor wafer carrier is in the second operative position rotating at the second RPM with the base. The apparatus includes nozzle means extending through the opening for spraying a fluid stream against the lower surface of the wafer when the wafer is in the first operative position rotating with the base.

Turning now to the drawings, which depict the presently preferred embodiments of the invention for the purpose of illustrating the practice thereof and not by way of limitation of the scope of the invention, and in which like reference characters refer to corresponding elements throughout the several views, FIG. 1 illustrates semiconductor wafer spin drying apparatus constructed in accordance with the invention and including base 11 rotatable about vertical axis 12. Base 11 includes counterweight 13 and flywheel 14 attached to lower portion 70 of base 11. Continuous belt 15 extends around flywheel 14 and wheel 16. Axle 17 carries wheel 16. Motor 18 provides motive power which rotates axle 17 and wheel 16 to displace belt 15 to turn flywheel 14 and base 11. Control arm means 19 is connected to and outwardly extends from base 11. Semiconductor wafer carrier 20 is connected to rod 21. Rod 21 is pivotally connected to control arm means 19 by mounting rod 21 in cylindrical bushings 22 and 23 carried in control arm means 19. Carrier 20 includes circular panel member 24 fixedly attached to the upper end of rod 21. A plurality of spaced apart wafer retaining feet 25 are mounted on the upper surface of member 24. Feet 25A, 25B support a circular semiconductor wafer 26 in the manner illustrated in FIG. 1 and FIGS. 6A to 6C such that lower surface 27 of wafer 26 faces the portion of base 11 positioned beneath wafer 26 and upper surface 28 of wafer 26 faces away from the portion of base 11 positioned beneath wafer 26. Base 11 rotates about fixed support member 30. When rotating about member 30, base 11 rides on wheel bearings 31, 32 positioned intermediate base 11 and member 30. Aperture or hollow 33 is formed through member 30. Spray arm 34 extends upwardly through aperture 33. Nozzle 35 attached to the upper end of arm 34 directs a stream of fluid 36 against lower surface 27 of wafer 26. Spray arm 34 is hollow and carries fluid to nozzle 35. The means for directing fluid under pressure into hollow arm 34 is omitted from FIG. 1 for the sake of clarity. Any pump-conduit combination or other means well known in the art can be utilized to direct fluid into arm 34 and out nozzle 35. Arm 34 is pivotally attached 37 to the wall of hollow 33 and is pivotally attached 38 to clevis 39. Motive power means or actuator 40 displaces clevis 39 in the directions of arrows A and B. When clevis 39 is displaced in FIG. 1 in the direction of arrow A, arm 34 pivots about points 37 and 38, and 38 causing nozzle 35 to move in the direction of arrow C to the position indicated by ghost outline 41. Displacing clevis 39 in the direction of arrow B from the position indicated by ghost outline 42 returns nozzle head 35 to its original position shown in FIG. 1. Flexible ribbed sleeve 43 covers aperture 33 and the upper portion of arm 34 to prevent water or other fluids from flowing into the aperture 33. Support member 30 can be fixedly secured to a table, to the floor, or to any other desired structure. Fluid can be directed upwardly from beneath member 30 through conduit 82 and against bottom surface 27 of wafer 26.

Figure 3:
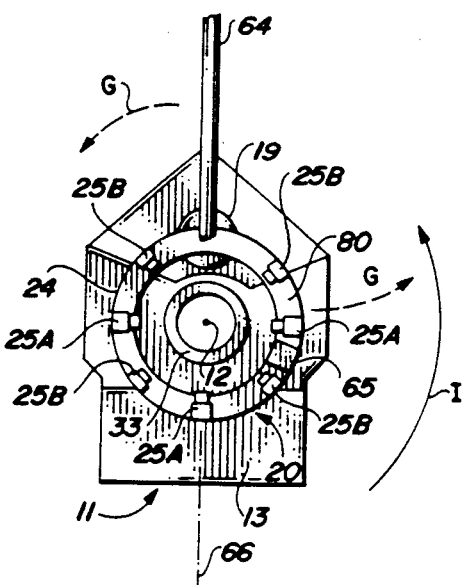
FIG. 3 is a top view of the apparatus of FIG. 2 illustrating the mode of operation thereof.
Figure 4:
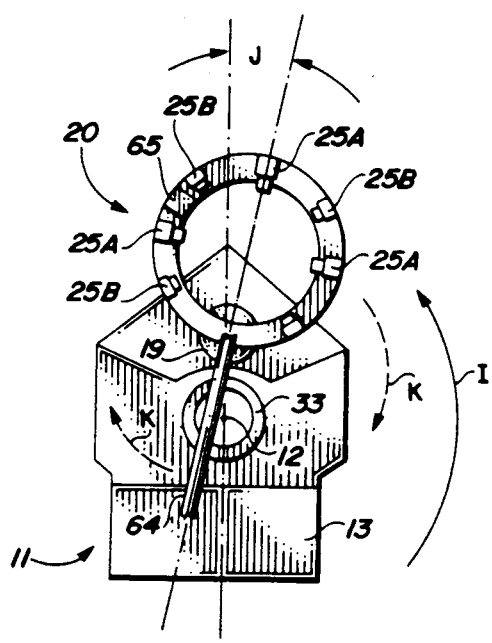
FIG. 4 is a top view of the apparatus of FIG. 2 further illustrating the mode of operation of the semiconductor spin drying apparatus of the invention.

As illustrated in FIGS. 3 and 4, feet 25A alternate with feet 25B around the upper surface of panel member 24. Each foot 25b is provided with a tip having an outer surface 81 which contacts the peripheral edge 26E of wafer 26 when wafer 26 is in carrier 20 (FIG. 6A). Each foot 25A includes surface 80 which downwardly slopes away from wafer 26 and, at the upper part of surface 80, contacts the lower or underside of peripheral edge 26E of wafer 26 (FIGS. 6B, 6C). Consequently, feet 25B prevent the lateral displacement of wafer 26 while feet 25A prevent wafer 26 from falling downwardly through or against member 24. The use of the alternating combination of feet 25A, 25B also provides a minimum number of points at which water or another fluid can be held or trapped intermediate wafer 26 and foot 25A, 25B.

Hollow support arm 44 is fixedly attached to clevis 45. Clevis 45 is pivotally connected 50 to arm 51, and is pivotally connected 52 to a fixed support structure (not shown). The distal end of arm 44 is attached and delivers fluid to nozzle 46. Fluid 47 from nozzle 46 is directed against upper surface 28 of wafer 26. Motive power means 48 displaces rod 51 in the direction of arrows D and E. When rod 51 is displaced in the direction of arrow E nozzle 46 moves in the direction of arrow F to the position indicated by ghost outline 49. Nozzles 35, 46 can deliver fluid under high pressure (4,000 to 5,000 psi) or under any desired pressure.

Wafer 26 is illustrated in FIG. 1 as being circular and having planar parallel opposed upper 28 and lower 27 surfaces. Wafer 26 and surfaces 27 and 28 can take on any desired shape, contour, and dimension.

The lower end 53 of rod 21 extends into a generally semi-cylindrical opening 54 formed in base 11. Opening 54 includes planar walls 55 and 56. Fin 57 is attached to and outwardly extends from end 53. When carrier 20 is in the preliminary operative position illustrated in FIG. 1, fin 57 bears against wall 55. In the preliminary operative position carrier 20 is in a first orientation with respect to control arm means 19 and base 11, and carrier 20 and circular wafer 26 are, along with aperture 33, centered on vertical axis 12. When base 11 is rotated by endless belt 15 around axis 12 at a slower number of revolutions per minute (RPM) which is less than a selected RPM, carrier 20 and wafer 26 continue to be centered on axis 12. When the RPM of base 11 is increased beyond the selected RPM, the centrifugal force acting on carrier 20 and/or wafer 26 causes carrier 20 and rod 21 to rotate outwardly in the manner indicated by arrow G until carrier 20 assumes the position indicated by ghost outline 58 in FIG. 1. When carrier 20 is in the secondary operative position indicated by ghost outline 58, carrier 20 is in a second orientation with respect to control arm means 19, and fin 57 has rotated to the position against wall 56 illustrated by ghost outline 59 in FIGS. 1 and 5. As will be described, a misbalance in the weighting of carrier 20 and/or wafer 26 is used to facilitate the rotation of carrier 20 to the position indicated by ghost outline 58 when the RPM of base 11 is increased beyond the selected number.

Figure 5:
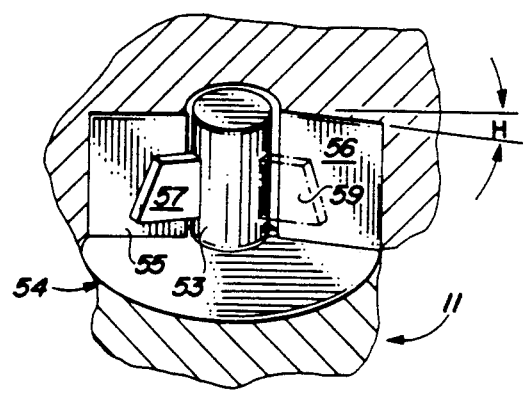
FIG. 5 is a section view of a portion of the apparatus of FIG. 1 further illustrating construction details thereof; and, FIGS. 6A to 6C illustrate the retaining feet used to secure a semiconductor wafer in the apparatus of FIGS. 1-4.

As illustrated in FIG. 5, wall 56 is at an angle, indicated by arrows H, with respect to flat planar wall 55. Wall 56 prevents carrier 20 from rotating a full 180° in the direction of arrow G from the primary operative position illustrated in FIG. 1. Allowing carrier 20 to rotate less than 180° in the direction of arrow G is desirable because it facilitates the return of carrier 20 to the resting position of FIG. 1 after the RPM of base 11 is slowed enough such that the centrifugal forces generated on carrier 20 no longer maintain carrier 20 in the position indicated by ghost outline 58 in FIG. 1.

In FIG. 1 wafer 26 and circular panel member 24 are perpendicular to axis 12. Axis 12 is parallel to axis 60. The angle 61 between axis 60 and the longitudinal axis of rod 21 is equivalent to the angle 62 between horizontal axis 63 and carrier 20 when carrier 20 is rotated by centrifugal force to the secondary operative position indicated by ghost outline 58 in FIG. 1. Axis 63 is perpendicular to axis 12. The tilting of the longitudinal axis of rod 21 therefore causes carrier 20 to be tilted when carrier 20 is rotated by centrifugal force from its preliminary operative position to the secondary operative position indicated by ghost outline 58. Such tilting of carrier 20 also, after the RPM of base 11 falls below a selected number or value, facilitates the return of carrier 20 to its preliminary operative position centered on axis 12 and generates a downward force vector which acts on wafer 26 to press it against surfaces 80 of feet 25A A resilient material can be placed over surfaces 55 and 56 to soften the contact of fin 57 with these surfaces. Alternatively, spring loading or various means utilized in combination with rod 21 can soften the blow of fin 57 against surfaces 55 and 56 during rotation of rod 21 in the direction of arrow G or in a direction opposite that of arrow G.

In FIGS. 2 to 4, a tail 64 is shown attached to and outwardly extending from carrier 20. Tail 64 serves as a counterbalance for carrier 20 and is omitted from FIG. 1 for the sake of clarity. Operation of the apparatus of the invention is further illustrated in FIGS. 2 to 4. Nozzles 35 and 46, motive power means 40 and 48, arms 34 and 44, clevis 45, clevis 39, and rod 51 have, for the sake of clarity, been omitted from FIGS. 2 to 4. Similarly, while it is assumed that in FIGS. 2 to 4 a wafer 26 is placed on and retained by feet 25, such a wafer has been omitted from FIGS. 2 to 4 for the sake of clarity.

FIG. 3 illustrates carrier 20 in its preliminary operative position. In FIG. 3 circular member 24 (as would a wafer 26 retained by feet 25) circumscribes, is centered on, and is perpendicular to axis 12. Carrier 20 occupies its preliminary operative position with respect to axis 12 and control arm means 19 when base 11 is stationary or is rotating at an RPM which is less than a selected RPM. A weight 65 is placed on member 24 intermediate and adjacent pair of feet 25. The addition of weight 65 misbalances carrier 20. If weight 65 is removed, the portion of carrier 20 (including tail 64) to the right hand side of horizonatal axis 66 in FIG. 3 is symmetrical with and equal in weight to the portion of carrier 20 to the left hand side of horizontal axis 66 in FIG. 3. The purpose of weight 65 is, after the RPM of base 11 is increased to a number greater than the selected number in order to produce a centrifugal force having a selected magnitude and acting on carrier 20, to create a torque or rotation force which acts on and displaces carrier 20 in the direction indicated by arrows G in FIG. 3. Weight 65 can also be placed on a wafer 26 in carrier 20 at a location adjacent point 80 (FIG. 3) to misbalance wafer 26. When carrier 20 rotates from its primary operative position in the direction indicated by arrows G in FIG. 3, rod 21 (FIG. 1) simultaneously rotates with carrier 20 in the direction of arrow G. When the centrifugal force acting on carrier 20 is sufficient to move carrier 20 in the direction of arrow G, carrier 20 continues to rotate outwardly away from axis 12 until fin 57 contacts planar surface 56 (FIGS. 1 and 5). When fin 57 contacts planar surface 56 the rotation by centrifugal force by carrier 20 is halted and carrier 20 is in its secondary operative position with respect to axis 12 and control arm means 19. FIG. 4 illustrates the secondary operative position of carrier 20. In FIG. 4 carrier 20 has completed its outward rotation away from axis 12 and fin 57 has contacted and is bearing against planar surface 56. In FIGS. 3 and 4 the direction of rotation of base 11 is indicated by arrow I while base 11 rotates in the direction of arrow I, carrier 20 maintains its secondary operative position, i.e., maintains its second orientation with respect to control arm means 19 and to axis 12, as long as the RPM of base 11 exceeds a selected number. The number of RPM necessary to generate a centrifugal force sufficient to rotate carrier 20 away from its preliminary operative position to its secondary operative position depends on factors including the mass and position of weight 65, shape of member 24, shape of wafer 26, frictional forces acting on rod 21, mass of rod 21, etc. These factors can be varied as desired. When the RPM of base 11 falls below a selected number, carrier 20 moves from its secondary to its preliminary operative position.

As can be seen in FIG. 4, the arc of rotation of carrier 20 from its preliminary operative position in FIG. 3 to its secondary operative position in FIG. 4 is equal to 180° minus the angle indicated by arrows J. As long as base 11 continues to rotate in the direction of arrow I at an RPM greater than a selected RPM, the centrifugal force acting on carrier 20 is sufficient to maintain carrier 20 in its secondary orientation shown in FIG. 4 with respect to base 11, means 19, and axis 12. When the RPM of base 11 falls below a selected number, the centrifugal force acting on carrier 20 is no longer sufficient to maintain carrier 20 in the position of FIG. 4, and carrier 20 rotates or pivots in the direction indicated by arrows K and returns to its first orientation (FIG. 3) with respect to base 11 and axis 12.

In FIG. 1, base 11 rotates about axis 12, and wafer 26 and carrier 20 are, when carrier 20 is in its preliminary operative position, perpendicular to axis 12. As would be appreciated by those of skill in the art, the apparatus of the invention can be constructed such that when carrier 20 is in its preliminary operative position wafer 26 is not perpendicular to axis 12. For example, wafer 26 can be perpendicular to axis 12A in FIG. 2. It is only necessary that carrier 20 move or spin about an axis in a preliminary path of travel when the RPM of base 11 is less than a selected number and that carrier 20 be moved by centrifugal force to an outer secondary operative position and secondary path of travel when the RPM of base 11 is greater than a selected number. When carrier 20 is in its preliminary operative position the centerpoint of circular wafer 26 need not continuously coincide with axis 12 while base 11 rotates. Carrier 20 and wafer 26 can both be offset from axis 12 such that when carrier 20 is in its preliminary operative position and base 11 is rotating, the centerpoint of circular wafer 26 follows a path of travel which is spaced away from and circumscribes the axis of rotation 12 of base 11. When carrier 20 is so offset from axis 12, the centerpoint of circular wafer 26 circumscribes a path around axis 12 when carrier 20 is in either of its preliminary and secondary operative positions. Nozzle 35 can be carried on base 11. Nozzles 35, 46 can rinse wafer 26 when base 11 is stationary.

Feet 25 on circular member 24 support wafer 26 and prevent the lateral displacement of the wafer 26. In FIG. 1, wafer 26 can, however, be upwardly pushed free from feet 25. Consequently, when nozzles 35 and 46 are utilized to direct fluid against the bottom 27 and top 28 surfaces, respectively, of wafer 26, streams 36 and 47 must contact wafer 26 at the same moment or stream 47 must contact wafer 26 first to prevent stream 36 from tending to push wafer 26 upwardly free from feet 25. The force against wafer 26 generated by stream 47 must be greater than or equal to the force generated by stream 36. Spray streams 36 and 47 are typically fan shaped, but can take on any desired shape.

As earlier noted, the misbalancing of carrier 20 or wafer 26 facilitates the production of a torque which rotates carrier 20 from its preliminary operative position outwardly to its secondary operative position. Such misbalancing can be accomplished by the addition of a weight 65 to a balanced, symetrical carrier 20 or wafer 26, or can be accomplished by intially forming the carrier 20 or wafer 26 so that it is misbalanced such that when the RPM of base 11 exceeds a selected number, the centrifugal force acting on the misbalanced carrier 20 or wafer 26 generates a torque sufficient to rotate the carrier 20 from its preliminary operative position to its secondary operative position. Attaching an auxilliary weight or mass to rod 21 sufficient, when centrifugal forces act on the weight, to produce a torque on the weight to rotate rod 21 to move carrier 20 from its preliminary operative position to its secondary operative position is, for purposes of this disclosure, deemed to comprise a misbalancing of the carrier 20. Such an auxiliary weight would likely, but not necessarily, extend from rod 21 generally toward one side of axis 12 when carrier 20 is in its preliminary operative position. In FIG. 1, axis 12 passes through the centerpoint of circular wafer 26.

Having described my invention in such terms as to enable those skilled in the art to understand and practise it, and having identified the presently preferred embodiments thereof, I claim:

1. Apparatus for spin drying a semiconductor wafer by centrifugal force, said wafer having an upper surface and a lower surface, said apparatus comprising
  (a) a base rotatable about a first selected axis at variable RPM's including a first RPM and a second RPM greater than the first RPM;
  (b) control arm means spaced away from said axis and connected to and outwardly extending from said base;
  (c) a carrier spaced away from said base for supporting said semiconductor wafer, said lower surface faces said base;
  (d) means for pivotally connecting said semiconductor wafer carrier to said control arm means to pivot said carrier about a second selected axis different from said first selected axis; said semiconductor wafer carrier moving between at least two operative positions,
  (e) a first operative position with said wafer in said carrier spaced away from said base and in a first orientation with respect to said control arm means, and
  (f) a second operative position with said wafer pivoted by centifugal force about said second axis away from said first selected axis to a second orientation with respect to said control arm means;
  (g) said semiconductor wafer carrier, and
  (h) said semiconductor wafer comprising a pair, at least one of said pair,
being weighted such that when said base is rotated at
  (i) said first RPM said semiconductor wafer carrier is in said first operative position rotating at said first RPM with said base, and
  (j) said second RPM said semiconductor wafer carrier is in said second operative position rotating at said second RPM with said base; and,
  (k) nozzle means for spraying a fluid stream against said lower surface of said wafer when said wafer is in said first operative position rotating at said second RPM with said base.

2. The apparatus of claim 1 wherein said spray nozzle means is mounted on and rotates with said base.

3. The apparatus of claim 1 wherein said spray nozzle means extends upwardly through an opening formed in said base such that said nozzle means is separate and free from said base and said base rotates about said nozzle means.

4. Apparatus for spin drying a semiconductor wafer by centrifugal force, said wafer having an upper surface and a lower surface, said apparatus comprising
   (a) a base rotatable about a first selected axis at variable RPM's including a first RPM and a second RPM greater than the first RPM;
   (b) control arm means spaced away from said axis and connected to and outwardly extending from said base;
   (c) a carrier spaced away from said base for supporting said semiconductor wafer,
   (d) means for pivotally connecting said semiconductor wafer carrier to said control arm means to pivot said carrier about a second selected axis different from said first selected axis;
said semiconductor wafer carrier moving between at least two operative positions,
   (e) a first operative position with said wafer in said carrier spaced away from said base in a first orientation with respect to said control arm means and intersected by said first selected axis, and
   (f) a second operative position with said wafer pivoted by centrifugal force about said second axis away from said first operative position and from intersection with said first selected axis to a second orientation with respect to said control arm means;
   (g) said semiconductor wafer carrier, and
   (h) said semiconductor wafer comprising a pair, at least one of said pair, being weighted such that when said base is rotated at
   (i) said first RPM said semiconductor wafer carrier is in said first operative position rotating at said first RPM with said base, and
   (j) said second RPM said semiconductor wafer carrier is in said second operative position rotating at said second RPM with said base.

5. Apparatus for spin drying a semiconductor wafer by centrifugal force, said wafer having an upper surface and a lower surface, said apparatus comprising
   (a) a base rotatable about a first selected axis at variable RPM's including a first RPM and a second RPM greater than the first RPM;
   (b) control arm means spaced away from said axis and connected to and outwardly extending from said base;
   (c) a carrier spaced away from said base for supporting said semiconductor wafer,
   (d) means for pivotally connecting said semiconductor wafer carrier to said control arm means to pivot said carrier about a second selected axis different from said first selected axis;
   (e) an opening formed about said first axis and extending through said base;
said semiconductor wafer carrier moving between at least two operative positions,
   (f) a first operative position with said wafer in said carrier spaced away from said base over said opening and intersected by and centered on said first selected axis in a first orientation with respect to said control arm means, and
   (g) a second operative position with said wafer pivoted by centrifugal force about said second axis away from said first operative position and from intersection with said first selected axis to a second orientation with respect to said control arm means;
   (h) said semiconductor wafer carrier, and
   (i) said semiconductor wafer comprising a pair, at least one of said pair being weighted such that when said base is rotated at
   (j) said first RPM said semiconductor wafer carrier is in said first operative position rotating at said first RPM with said base, and
   (k) said second RPM said semiconductor wafer carrier is in said second operative position rotating at said second RPM with said base.
   (l) nozzle means extending through said opening for spraying a fluid stream against said lower surface of said wafer when said wafer is in said first operative position rotating with said base.

* * * * *